United States Patent
Wiles, Jr.

(10) Patent No.: US 6,556,155 B1
(45) Date of Patent: Apr. 29, 2003

(54) METHOD AND INTEGRATED CIRCUIT FOR TEMPERATURE COEFFICIENT COMPENSATION

(75) Inventor: William W. Wiles, Jr., Melbourne, FL (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 0 days.

(21) Appl. No.: 10/079,194

(22) Filed: Feb. 19, 2002

(51) Int. Cl.[7] ................................ H03M 1/06
(52) U.S. Cl. ...................... 341/119; 341/155
(58) Field of Search ...................... 341/119, 118, 341/120, 139, 155

(56) References Cited

U.S. PATENT DOCUMENTS

| | | | |
|---|---|---|---|
| 5,488,368 A | * | 1/1996 | Brown ....................... 341/119 |
| 5,850,195 A | | 12/1998 | Berlien, Jr. et al. |
| 6,492,709 B2 | * | 12/2002 | Olson ....................... 341/119 |

* cited by examiner

*Primary Examiner*—Brian Young
(74) *Attorney, Agent, or Firm*—Michael J. Balconi-Lamica; Haynes and Boone, LLP

(57) ABSTRACT

An integrated circuit adapted to output a bandgap reference voltage with temperature coefficient compensation (VBG_TC) includes a first circuit responsive to a bandgap reference voltage (VBG) for generating a temperature stable reference current. A second circuit applies the temperature stable reference current through a current mirror to a current summing junction. A third circuit sums the temperature stable reference current against a current proportional to absolute temperature (IPTAT). Lastly, a fourth circuit converts the summed current into the bandgap reference voltage with temperature coefficient compensation (VBG_TC).

23 Claims, 7 Drawing Sheets

METHOD AND INTEGRATED CIRCUIT FOR TEMPERATURE COEFFICIENT COMPENSATION

This application relates to copending applications entitled "Method and Apparatus For Light to Frequency Conversion", inventor William W. Wiles, Jr. Ser. No. 10/078,811 and "Method and Integrated Circuit For Bandgap Trimming", inventor William W. Wiles, Jr. Ser. No. 10/078,813 filed concurrently herewith, assigned to the assignee of the present disclosure, and incorporated herein by reference.

BACKGROUND

The present invention relates generally to semiconductor devices, and more particularly, to a method and integrated circuit for temperature coefficient compensation.

A number of optoelectronic systems applications require an accurate measurement of the intensity of a light beam or incident light, the measurement being performed over large ranges of input signal amplitude and wavelength. It is desired that the measurement accuracy be maintained over a wide range of environmental conditions. In addition, it is desired that the measurement be made in a minimal volume as dictated by packaging considerations and at a cost commensurate with consumer type systems.

Typical system requirements dictate that an incident light intensity needs to be converted to a digital form for use by a digital processor. To accomplish this, the light intensity is converted to an electrical form that can be digitized. For example, one technique applicable to sampled data processor systems includes converting the light intensity to a voltage that can be applied to an A/D Converter (ADC). This method however requires an additional analog block (i.e., the ADC), but can be used in those applications requiring a higher bandwidth. A second technique, applicable to very low bandwidth applications, includes directly converting the light intensity into a frequency that can be counted by a digital processor.

U.S. Pat. No. 5,850,195 entitled "MONOLITHIC LIGHT-TO-DIGITAL SIGNAL CONVERTER," issued Dec. 15, 1998, discloses a converter having a switched capacitor oscillator in which the reference function is included in the oscillator circuit. The switched capacitor oscillator requires that calibration be accomplished by trimming the capacitors of the oscillator. However, the oscillator has a high level of parasitic capacitance which limits its high frequency performance. In addition, certain applications, including infrared incident intensity, for example, require a different temperature coefficient which cannot be implemented in an efficient manner in the oscillator circuit of the '195 converter.

It would be desirable to provide a light to frequency converter and light to frequency conversion technique for overcoming the above discussed problems in the art.

SUMMARY

According to one embodiment of the present disclosure, an integrated circuit adapted to output a bandgap reference voltage with temperature coefficient compensation (VBG_TC) includes a first circuit responsive to a bandgap reference voltage (VBG) for generating a temperature stable reference current. A second circuit applies the temperature stable reference current through a current mirror to a current summing junction. A third circuit sums the temperature stable reference current against a current proportional to absolute temperature (IPTAT). Lastly, a fourth circuit converts the summed current into the bandgap reference voltage with temperature coefficient compensation (VBG_TC). A method for generating a bandgap reference voltage with temperature coefficient compensation is also disclosed.

DETAILED DESCRIPTION

Figure 1:
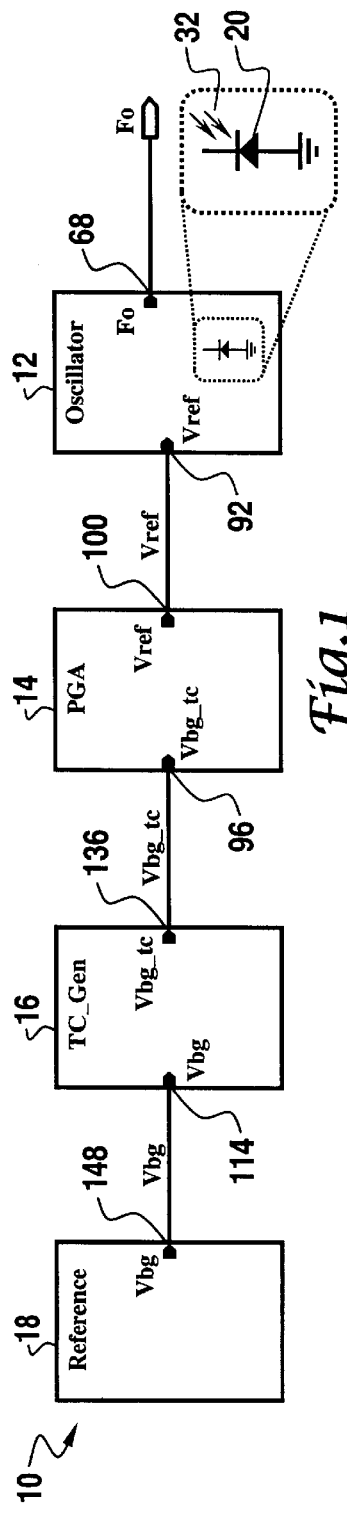
FIG. 1 is an electrical block diagram of a light-to-frequency converter according to one embodiment of the present disclosure.

With reference to FIG. 1, a light-to-frequency converter according to one embodiment of the present disclosure is referred to, in general, by the reference numeral 10. The light-to-frequency converter 10 includes a current controlled oscillator (Oscillator) 12, a programmable amplifier (PGA) 14, a temperature coefficient generator (TC_Gen) 16, and a bandgap voltage generator (Reference) 18. Briefly, the bandgap voltage generator 18 outputs a bandgap reference voltage (VBG). Temperature coefficient generator 16 outputs the bandgap reference voltage with temperature coefficient compensation (VBG_TC), in response to receiving VBG on its input. Programmable gain amplifier 14 outputs an oscillator reference voltage (VREF) in response to VBG_TC.

Lastly, current controlled oscillator 12 includes at least one photodiode 20. In response to VREF, a photodiode control current, and a feedback current, the current controlled oscillator 12 produces an output signal having a frequency ($F_O$) proportional to an intensity of incident light upon the photodiode, as will be discussed further below.

In one embodiment, the current controlled oscillator 12 includes a switching capacitor configured to provide a feedback current. With respect to the switched capacitor feedback current, the bandgap reference voltage with temperature coefficient compensation (VBG_TC) modifies a temperature coefficient of the feedback current to match a temperature coefficient of the photodiode control current.

Figure 2:
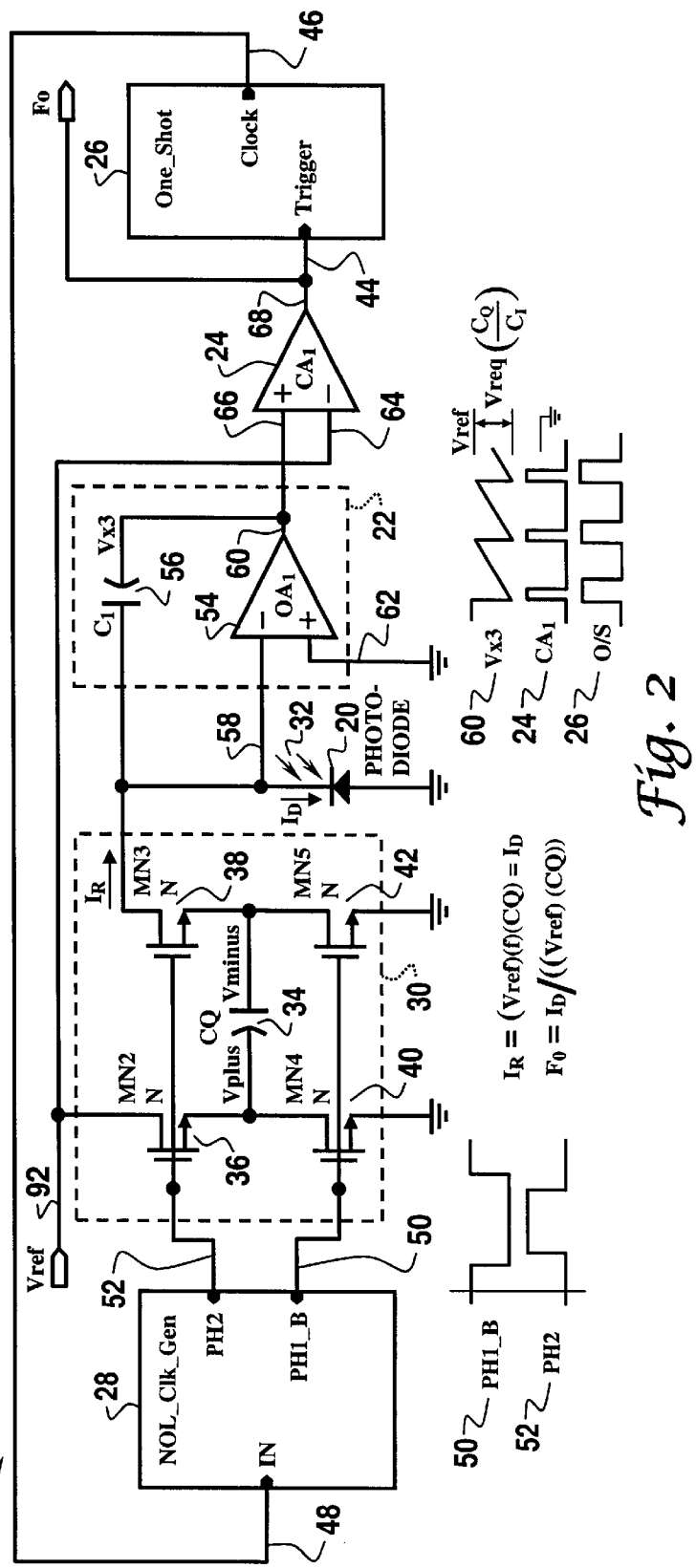
FIG. 2 is an electrical block diagram of a current controlled oscillator of the light to frequency converter of FIG. 1, according to another embodiment of the present disclosure.

Referring now to FIG. 2, according to one embodiment, the current controlled oscillator 12 includes at least one photodiode 20, an integrator 22, a comparator 24, a one shot 26, a non-overlapping clock generator 28, and a switched capacitor resistor configuration 30. Photodiode 20 provides a source of controlling current ($I_D$). The control current ($I_D$) is directly proportional to an intensity of light 32 incident on the diode 20. Integrator 22 provides for the summing of the control current ($I_D$) against a feedback current ($I_R$). Switched capacitor resistor configuration 30 generates the feedback current ($I_R$) with the application of VREF to the switched capacitor resistor operating at a frequency of operation ($F_O$).

The switched capacitor resistor configuration 30 includes the switching capacitor (CQ) identified by reference numeral 34 and MOS switches (MN2–MN5) identified by reference numerals 36, 38, 40, and 42, respectively. Switched capacitor resistor configuration 30 has a first input coupled to a first non-overlapping clock output 50 of non-overlapping clock generator 28, a second input coupled to a second non-overlapping clock output 52 of the non-overlapping clock generator 28, and a voltage reference input coupled to the oscillator reference voltage (VREF), identified by reference numeral 92. In one embodiment, switching capacitor (CQ) 34 includes a single untrimmed capacitor.

Responsive to the first, second, and voltage reference inputs, the switched capacitor resistor configuration 30 provides feedback current ($I_R$) operating at the frequency of operation ($F_O$). The frequency of operation ($F_O$) is a function of the control current ($I_D$), the oscillator reference voltage (VREF), and a capacitance of the switching capacitor (CQ).

Under steady state conditions, feedback current ($I_R$) is equal to (VREF)($F_O$)(CQ). This results in the following expression for the frequency of operation:

$$F_O = I_D/(VREF)(CQ)$$

The current controlled oscillator 12 further includes a one-shot 26 responsive to a trigger input at 44 for providing a one-shot clock output at 46. Responsive to the one-shot clock output at input 48, the non-overlapping clock generator 28 provides non-overlapping clock signals, as further discussed below, on the first and second non-overlapping clock outputs, 50 and 52, respectively.

Integrator 22 includes an op-amp (OA1) 54 and a feedback capacitor (CI) 56, the feedback capacitor coupled between an inverting input 58 of op-amp (OA1) 54 and the output 60 of op-amp (OA1) 54. In the embodiment of FIG. 2, the non-inverting input 62 of op-amp (OA1) 54 is coupled to ground potential. Integrator 22 integrates a sum of the control current ($I_D$) and the feedback current ($I_R$) to provide an output voltage $V_{X3}$ at 60.

Comparator 24 includes an op-amp (CA1) with an inverting input 64, a non-inverting input 66, and an output 68. Responsive to the reference voltage (VREF) coupled to the inverting input 64 and the integrator output 60 coupled to the non-inverting input 66, comparator 24 provides a pulse signal output on 68 having a frequency of oscillation ($F_O$) representative of the intensity of incident light. The pulse signal output 68 is further coupled to the trigger input 44 of the one-shot 26.

Figure 3:
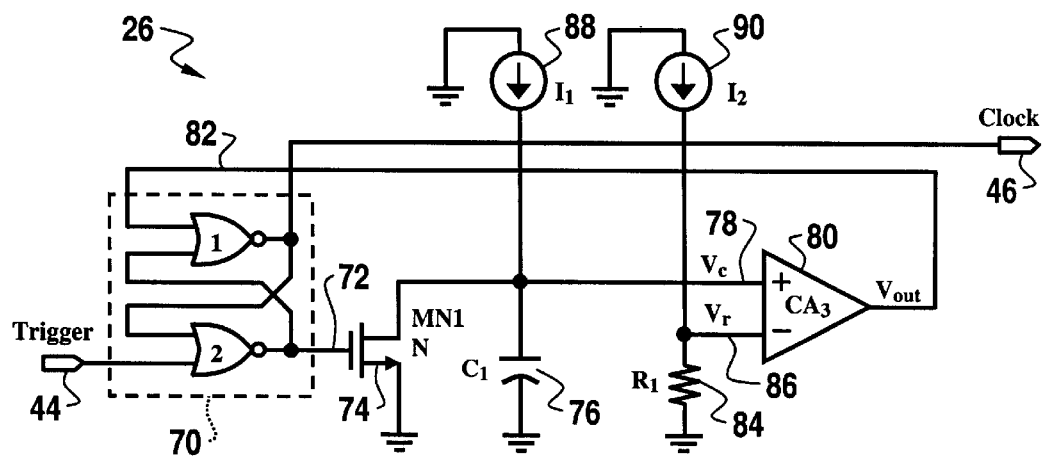
FIG. 3 is an electrical schematic diagram of the one shot circuit of the current controlled oscillator of FIG. 2.

Referring briefly to FIG. 3, one-shot 28 includes a NOR latch 70 having an input corresponding to the trigger input 44. The NOR latch 70 furthermore has a first output 72 coupled to a MOS switch 74 and a second output 46 coupled to the clock input 48 of the non-overlapping clock generator 28 (FIG. 2). The switch 74 is configured to discharge a capacitor 76 coupled to a non-inverting input 78 of a comparator (CA3) 80. The comparator 80 outputs a reset signal input 82 to the NOR latch 70 in response to a voltage of the capacitor (C1) 76 reaching the level of a voltage across a resistor (R1) 84. Resistor (R1) 84 is coupled to the inverting input 86 of the comparator 80. Lastly, current sources (I1) 88 and (I2) 90 provide current to capacitor (C1) 76 and resistor (R1) 84, respectively.

Figure 4:
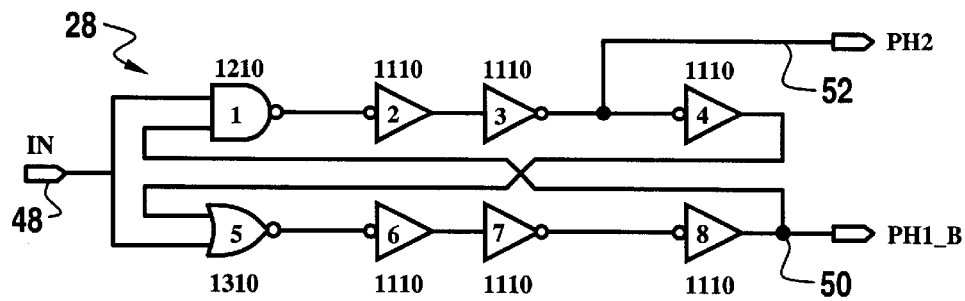
FIG. 4 is an electrical schematic diagram of the non-overlapping clock generator of FIG. 2.

FIG. 4 is an electrical schematic diagram of the non-overlapping clock generator (NOL) 28 of FIG. 2. Generator 28 provides a first non-overlapping clock output at 50 and a second non-overlapping clock output at 52 in response to a clock input at 48. Non-overlapping clock generator 28 can include any suitable circuit configuration known in the art.

Current controlled oscillator 12 of FIG. 2 operates as follows. Assume that the outputs of comparator (CA1) 24 and the one shot 26 are both low and that the photodiode current ($I_D$) is applied to the integrator 22. As noted above, integrator 22 includes operational amplifier (OA1) 54 and capacitor (CI) 56. Accordingly, this results in the voltage ($V_{X3}$) at 60 ramping positive. When $V_{X3}$ reaches VREF, comparator (CA1) 24 switches high and sets the NOR latch 70 in the one shot 26 (FIG. 3). The first output 72 of the latch releases switch (MNI) 74, while the other output 46 is applied to the input 48 of the non-overlapping clock generator (NOL) circuit 28 (FIG. 4).

With the one shot output 46 initially low, NOL output (PH2) 52 is also low, holding switches (MN2) 36 and (MN3) 38 off while output (PH1B) 50 is high. Output (PH1B) 50 high turns switches (MN4) 40 and (MN5) 42 on, thus shorting both sides of capacitor (CQ) 34 to ground. Shorting both sides of capacitor (CQ) 34 to ground sets the capacitor charge to zero (0). When one shot output 46 (NOL input 48) goes high, output (PH1B) 50 goes low initially. Output (PH1B) 50 going low turns off switches (MN4) 40 and (MN5) 42. This is followed by output (PH2) 52 transitioning high.

Output (PH2) 50 transitioning high turns switches (MN2) 36 and (MN3) 38 ON. The switching ON of switches (MN2) 36 and (MN3) 38 injects a packet of charge equal to (VREF)*(CQ) into the summing node 58 and a current is caused to flow through the integrator capacitor (CI) 56, driving $V_{X3}$ at 60 negative by an amount equal to (VREF)(CQ)/(CI). Accordingly, this results in the output voltage $V_{X3}$ at 60 having a sawtooth waveform, as shown in FIG. 2. As the charge transfer is completed, $V_{X3}$ begins to ramp positive, eventually reaching VREF and the cycle repeats itself at a frequency proportional to the input control current ($I_D$).

If perfect components were available, the $V_{X3}$ waveform would be the theoretical sawtooth and the one shot 26 would not be needed. However, parasitic switch resistances and a finite op-amp (OA1) bandwidth introduce a minimum time requirement for settling which is of paramount importance for accurate charge transfer. Since the comparator (CA1) 24 pulse width will be smaller than this minimum time, the need for a one shot is introduced to guarantee enough time for settling.

The one shot circuit of FIG. 3 operates as follows. When the input signal (TRIGGER) at 44 goes high, it sets the NOR latch 70, releasing switch (MNI) 74 and generates the output clock signal CLOCK at 46. The voltage at node (Vc) 78 ramps positive until it reaches the voltage at node (Vr) 86, i.e., equal to (I2)(R1). At that time, (T=R1*C1*I2/I1), the comparator output 82 switches high, resetting the NOR latch 70, which removes the CLOCK signal at 46 and discharges the capacitor 76 through switch (MN1) 74. The one shot circuit 26 is then ready for the next input trigger at 44.

As discussed above, the charge packet size (VREF)*(CQ) determines the frequency of oscillation ($F_O$) that will occur for a given incident light intensity. To minimize the parasitics in the oscillator circuit 12 (which maximizes the operational frequency), oscillator 12 utilizes a single untrimmed capacitor (CQ) 34. The problem that this introduces, however, is that the capacitor 34 usually has a significant tolerance associated with it and this tolerance is typically wider than the calibrated limits desired. Accordingly, to offset the capacitor tolerance, it is necessary to vary the reference voltage in a manner that doesn't affect the temperature stability of the reference.

To accomplish varying the reference voltage in a manner that doesn't affect the temperature stability of the reference, the light to frequency converter 10 includes programmable gain amplifier (PGA) 14 inserted between the actual reference 18 and the oscillator input VREF at 92 (FIG. 1). The programmable gain amplifier 14 includes a standard non-inverting potentiometric configuration using discrete gain switches controlled, for example, by a 3 to 8 decoder. The gain range and the number of gain settings are determined by the initial capacitor tolerance and the final frequency tolerance requirement for a particular light-to-frequency converter application. Accordingly, the gain range and number of gain settings may vary from those described and shown herein.

Figure 5:
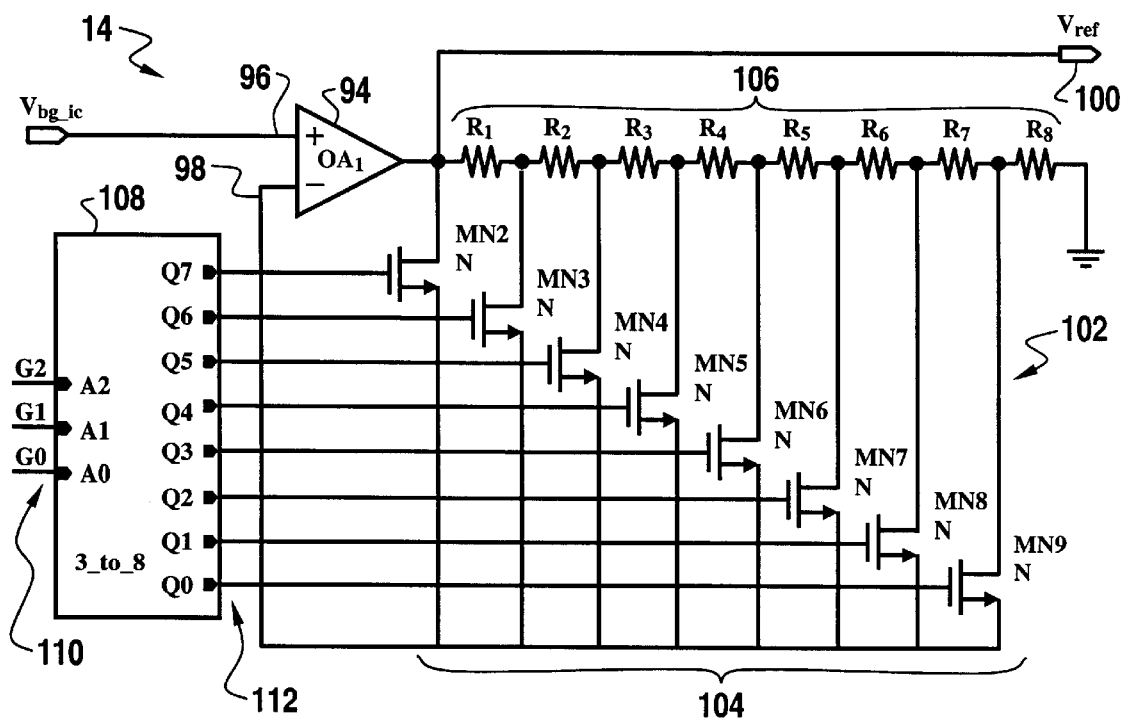
FIG. 5 is an electrical block diagram of the programmable gain amplifier of FIG. 1, according to one embodiment of the present disclosure.

Referring now to FIG. 5, in further detail, the programmable gain amplifier 14 includes an op-amp 94 having a non-inverting input 96, an inverting input 98, and an output 100. The band gap reference voltage with temperature coefficient compensation (VBG_TC) couples to the non-inverting input 96. The inverting input 98 couples to the output 100 via a potentiometric configuration, generally indicated by reference numeral 102. The potentiometric configuration 102 is adapted for selectively switching, via switches (MN2–MN9) generally indicated by reference numeral 104, one of zero, one, and more than one resistor of a plurality of serially coupled resistors (R1–R8), generally indicated by reference numeral 106, between the inverting input 98 and the output 100.

Figure 6:
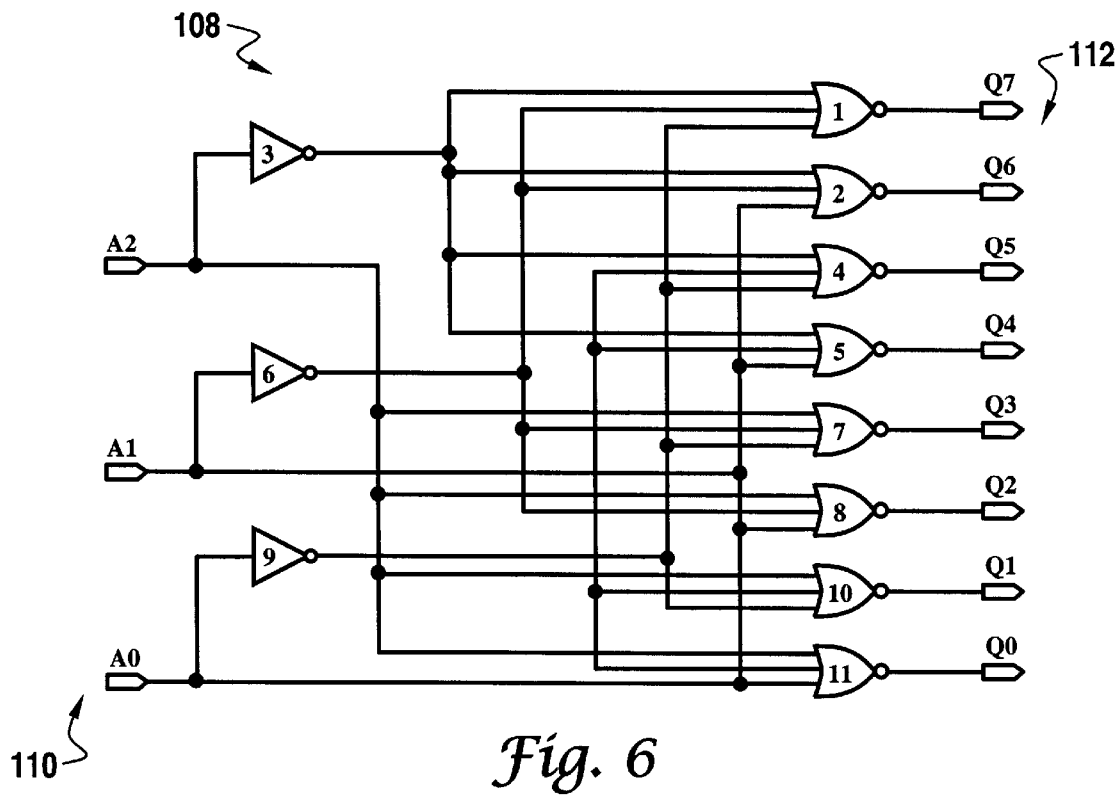
FIG. 6 is an electrical schematic diagram of the decoder of FIG. 5.

With reference still to FIG. 5, the potentiometric configuration 102 further includes an m-to-n decoder 108. The m-to-n decoder 108 includes m inputs (A0–A2), generally indicated by reference numeral 110, and n outputs (Q0–Q7), generally indicated by reference numeral 112. The m inputs (A0–A2) 110 are configured by input signals (G0–G2) for selecting a desired one of the n outputs (Q0–Q7) 112. The n outputs (Q0–Q7) 112 are coupled to respective switches (MN2–MN9) 104 and configured to selectively switch none, one, and more than one resistor of the plurality of serially coupled resistors (R1–R8) 106 between the inverting input 98 and the output 100. In one embodiment, the m-to-n decoder 108 includes a 3-to-8 decoder, such as shown in FIG. 6.

One of the practical aspects of light intensity to current (frequency) conversion involves the temperature coefficient versus the wavelength of the incident light intensity. In the visible spectrum, the coefficient is very flat, but it increases for wavelengths in the infrared region. For that reason, it is desirable to be able to modify the temperature coefficient of the switched capacitor current injection to match the temperature coefficient of the photodiode current. This can be accomplished by altering the bandgap voltage (VBG) to a voltage where the desired temperature coefficient resides, but to attain the proper range of temperature coefficients would require a very large voltage deviation. This would place additional range constraints on the PGA 14, or it would have to be compensated for by adding trim capability to the charge packet capacitor (CQ) 34. Either of these alternative would drive the complexity of the system up and reduce the higher frequency performance due to additional parasitic elements.

Figure 7:
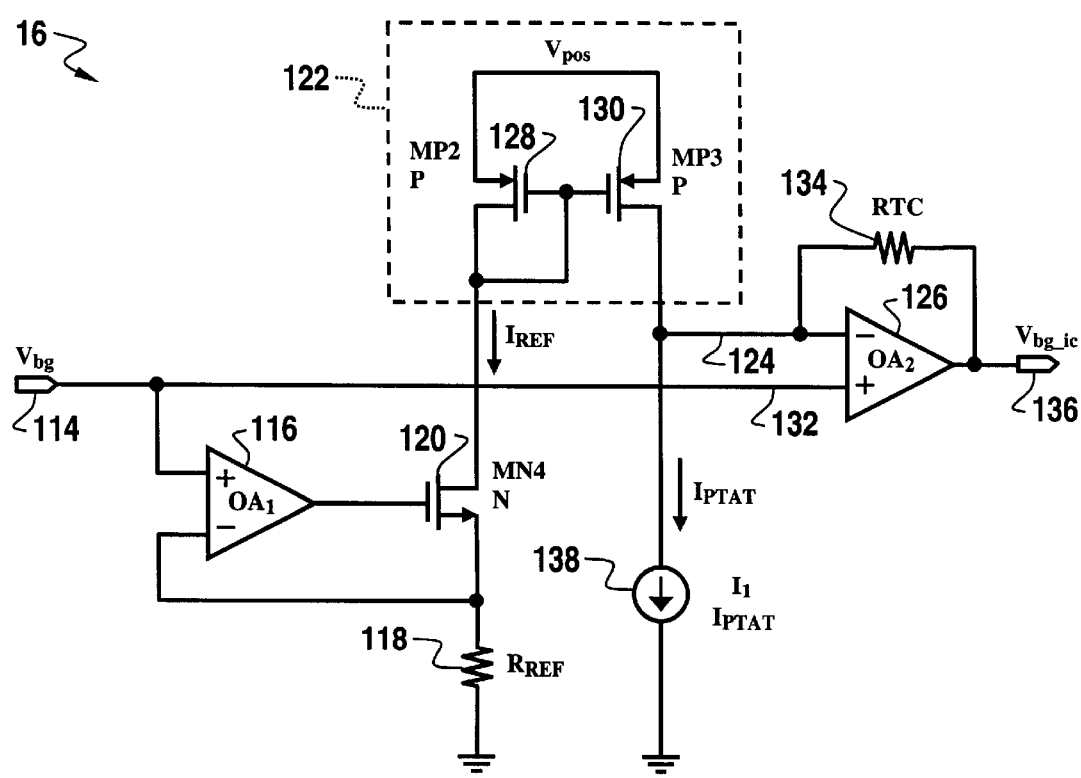
FIG. 7 is an electrical schematic diagram of the temperature coefficient generator of FIG. 1.

Accordingly, to add temperature coefficient modification capability without altering the PGA 14 or oscillator 12, the temperature generation circuit of FIG. 7 has been placed between the bandgap reference generator 18 and the PGA 16, such that:

$$VBG\_TC=VBG+(IPTAT-IREF)*RTC.$$

Referring now to FIG. 7, the temperature coefficient generator 16 includes a circuit responsive to the bandgap reference voltage (VBG) at input 114 for generating a temperature stable reference current $I_{REF}$ equal to (VBG/RREF) via op-amp (OA1) 116, resistor (RREF) 118, and cascode transistor (MN4) 120. The temperature coefficient generator 16 applies the temperature stable reference current (VBG/RREF) through a current mirror 122 to a current summing junction 124 of an op-amp (OA2) 126. The current mirror 116 includes MOS devices (MP2) 128 and (MP3) 130. The temperature coefficient generator 16 sums the temperature stable reference current against a current proportional to absolute temperature (IPTAT) and converts the summed current, via the bandgap reference voltage applied to the non-inverting input 132 of op-amp (OA2) 126 and a feedback resistor (RTC) 134 coupled between the inverting input 124 and the output 136 of op-amp (OA2) 126, into the bandgap reference voltage with temperature coefficient compensation (VBG_TC) on output 136.

Figure 8:
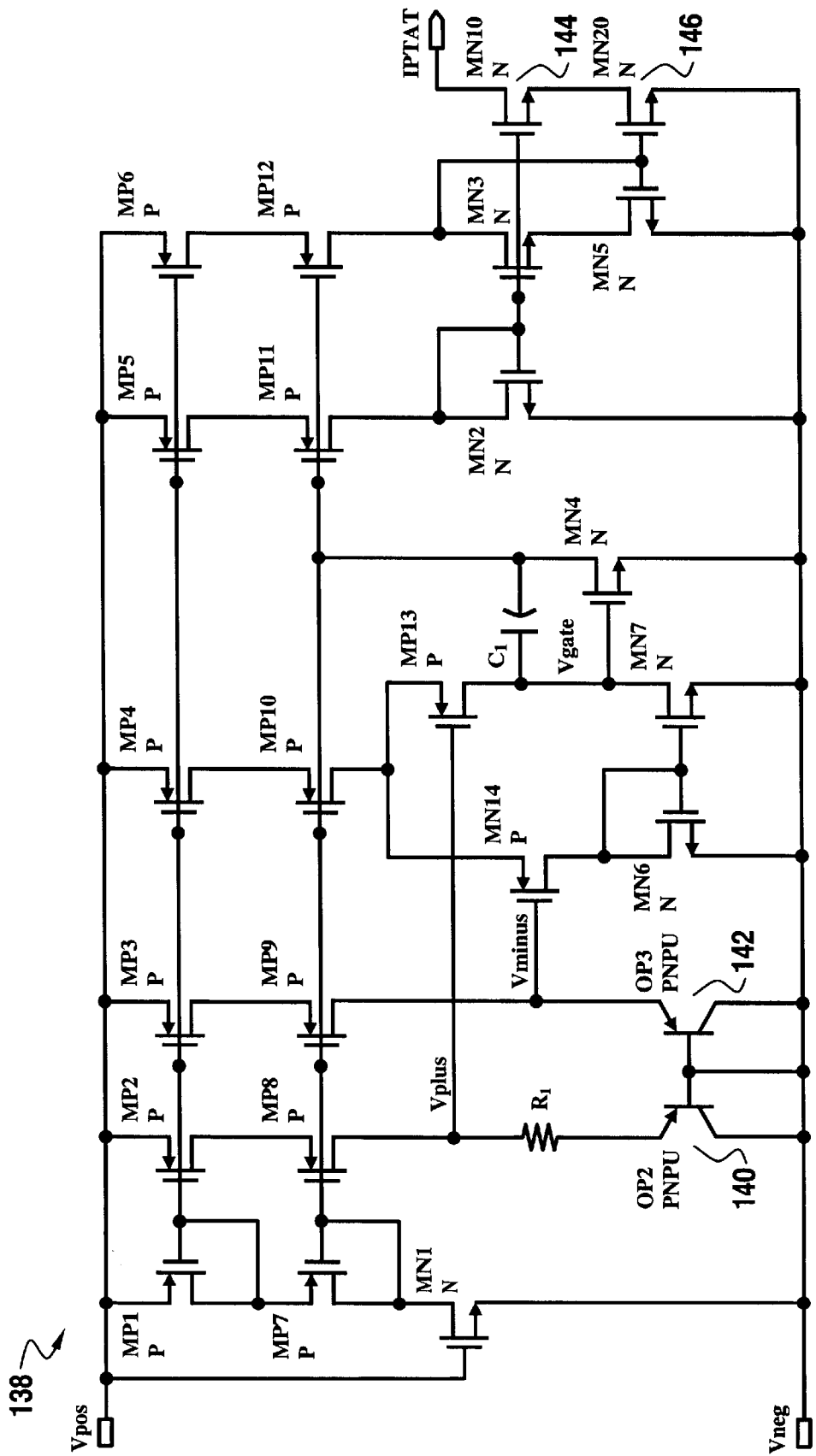
FIG. 8 is an electrical schematic diagram of the current proportional to absolute temperature (IPTAT) current generator of FIG. 7.

The temperature coefficient generator 16 of FIG. 7 further includes a generator 138 for providing the current proportional to absolute temperature (IPTAT). With reference now to FIG. 8, the generator 138 for providing the current proportional to absolute temperature (IPTAT) includes a circuit for deriving the current proportional to absolute temperature from matched emitter currents flowing in first and second transistors (QP2) 140 and (QP3) 142, respectively, and described by the expression:

$$IPTAT=A1*(kT/q)*\ln(A2/A3)*(1/R1),$$

where A1 is a current mirror gain provided by first and second output CMOS devices (MN10) 144 and (MN20) 146, k is Boltzman's constant, T is absolute temperature, q is electronic charge, A2 is the emitter area of transistor QP2, A3 is the emitter area of transistor QP3, and R1 is the resistance coupled to the emitter of transistor QP2.

In one embodiment, the value of the current proportional to absolute temperature (IPTAT) is set to match a reference current defined by the bandgap reference voltage divided by a reference resistance (VBG/RREF) at a temperature equal to 27 degrees Celsius (T=27° C.) such that the bandgap reference voltage with temperature coefficient compensation (VBG TC) equals the bandgap reference voltage (VBG) at that temperature. The intrinsic temperature coefficient of this current can then be described by taking the derivative of the IPTAT expression, yielding:

$$\partial IPTAT/\partial T = A1*(k/q)*\ln(A2/A3)*(1/R1),$$

which results in an output voltage temperature coefficient of:

$$\partial VBG\_TC/\partial T = A1*(k/q)*\ln(A2/A3)*(RTC/R1).$$

Accordingly, the temperature coefficient described can be controlled by the selection of resistor (RTC) 134. Controlling the temperature coefficient by selecting a value for resistor (RTC) 134 (FIG. 7) allows for operation at optimum temperature coefficient (TC) levels in the infrared spectrum without placing additional constraints on a remainder of the circuit.

Figure 9:
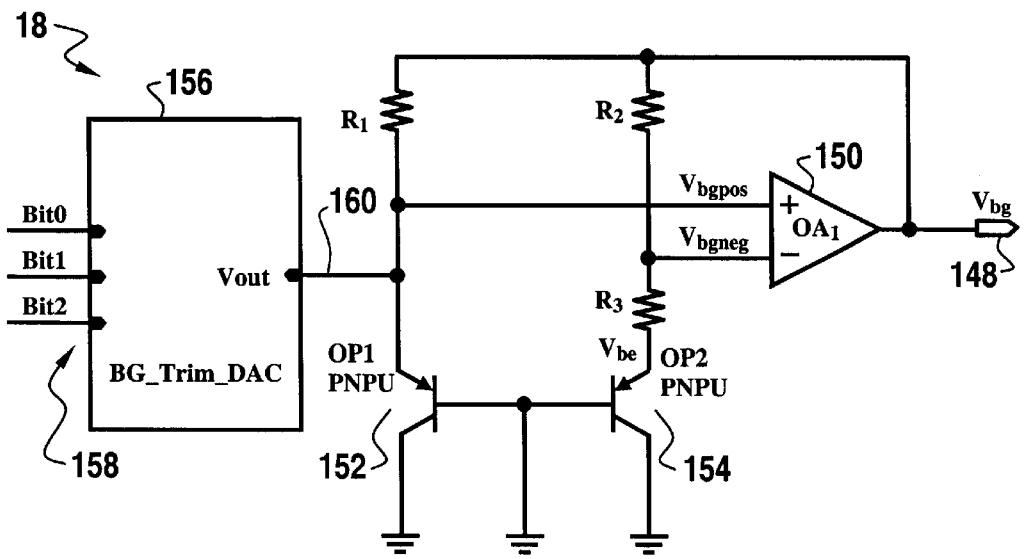
FIG. 9 is an electrical block diagram of the trimmable bandgap generator of FIG. 1, according to one embodiment of the present disclosure.

Referring now to FIG. 9, the bandgap reference voltage generator 18 of FIG. 1 provides for temperature stability and shall now be described in further detail. The circuit of FIG. 9 generates the bandgap reference voltage (VBG) at output 148, in part, with the use of a standard Bandgap configuration which produces an ideal output of:

$$VBG = VBE + \Delta VBE(R2/R3),$$

where:

$$\Delta VBE = (kT/q)*\ln(A2/A1).$$

Bandgap reference voltage generator 18 includes a circuit having an op-amp (OA1) 150 for equalizing emitter currents of a first transistor (QP1) and a second transistor (QP2), indicated by reference numerals, 152 and 154, respectively. However, the op-amp and transistor configuration is prone to offset errors, in addition to normal bandgap tolerances. The errors will modulate the $\Delta VBE$ term such that the total differential voltage ($V_X$) is the sum of $\Delta VBE$ and an error term $V_{os}$ according to:

$$V_x = (kT/q)*\ln(A2/A1) + V_{os}.$$

Accordingly, the circuit of FIG. 9 further includes means for trimming out the above-mentioned error to achieve desired calibrated frequency tolerances and temperature coefficients. The error includes, for example, an offset error $V_{os}$. In one embodiment, the means for trimming out error includes a transistor digital to analog converter (DAC) 156 configured to alter an effective emitter area of the first transistor (QP1) 152 for nulling the offset error, according to:

$$\Delta VBE = (kT/q)*\ln((A2/A1) \pm \Delta A1) + V_{os}.$$

Figure 10:
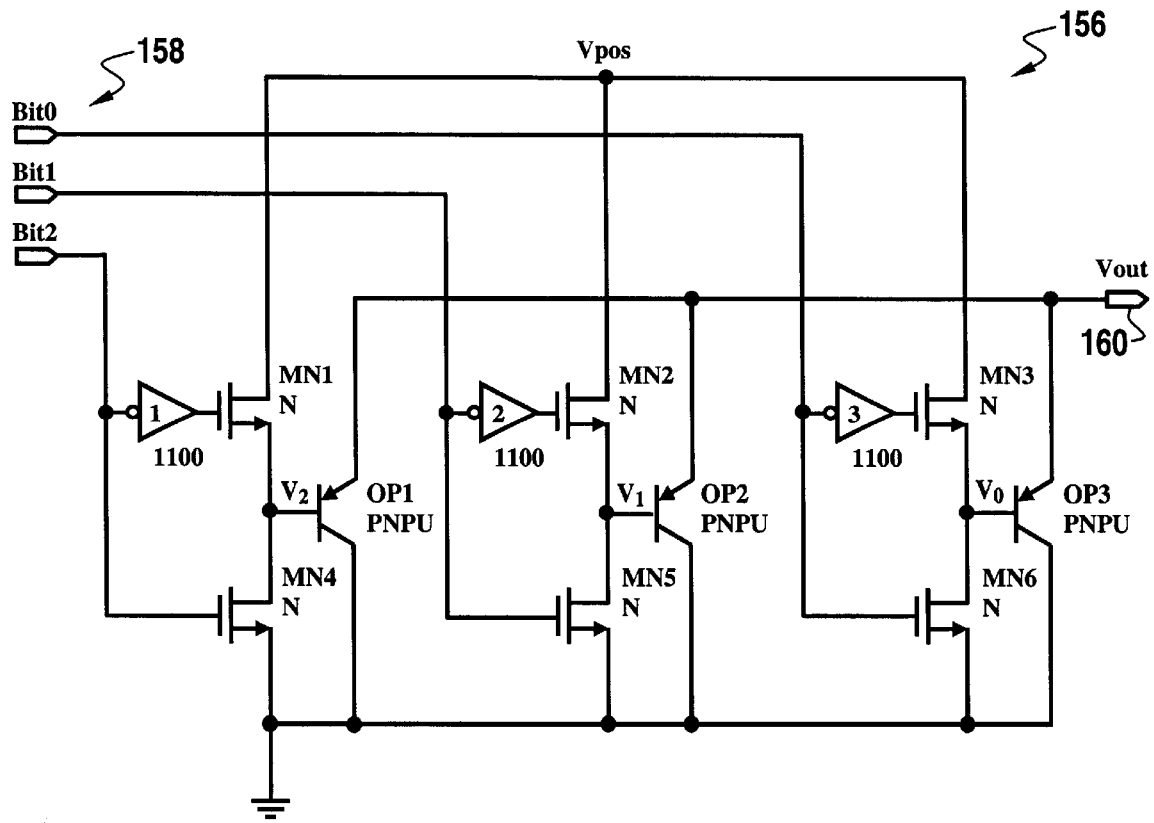
FIG. 10 is an electrical schematic diagram of the bandgap trim DAC of FIG. 9.

FIG. 10 is an electrical schematic diagram of the bandgap trim (DAC) 156 of FIG. 9 in greater detail. The DAC 156 includes at least two inputs 158 and an output 160. DAC 156 is responsive to the at least two inputs 158 for providing a voltage on the output 160 as a function of the at least two inputs. More particularly, DAC 156 provides a variable impedance from the output 160 to ground as a function of the at least two inputs 158. The variable impedance varies the current flowing in the first and second bandgap transistors (152 and 154, respectively), which in turn, varies the bandgap output voltage (VBG) at output 148.

In another embodiment, the trimming circuit and technique, as used in the embodiments of FIGS. 9 and 10, can also be used to trim any errors in the PTAT current flowing at T=27° C. in the embodiment of the IPTAT generator of FIG. 8. For example, in a circuit for equalizing emitter currents of a first transistor and a second transistor, a second circuit is provided to trim out error in at least one emitter current to achieve a desired frequency tolerance. The second circuit includes at least a single transistor digital to analog converter (DAC). In one instance, the error may include an offset error and the DAC is configured to alter the effective emitter area of one of the transistors for nulling the offset error. Still further, the DAC includes at least two inputs and an output, the DAC responsive to the at least two inputs for providing a variable impedance from the output to ground as a function of the at least two inputs. Accordingly, the variable impedance will vary the current flowing in the first and second transistors.

Figure 11:
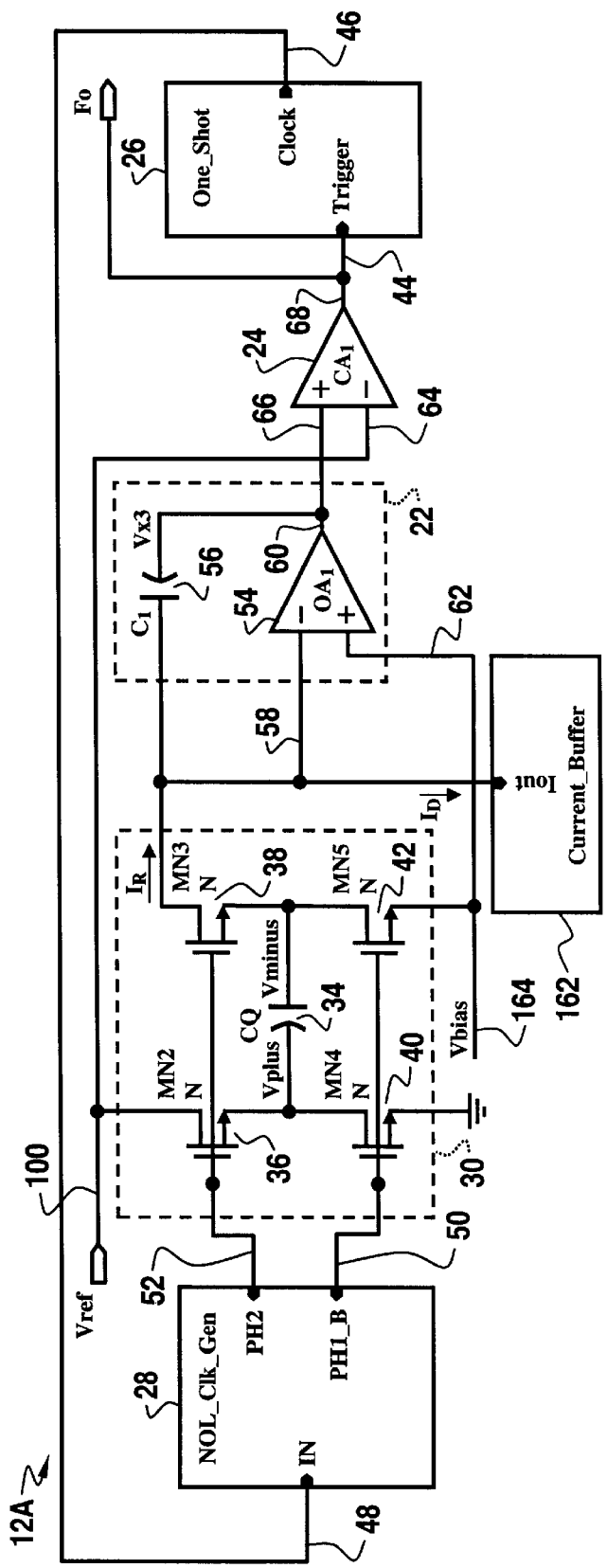
FIG. 11 is an electrical block diagram of a current controlled oscillator of the light to frequency converter of FIG. 1, according to another embodiment of the present disclosure.

As shown in FIG. 2, the oscillator configuration includes photodiode tied directly to the integrator summing junction. While this biases the diode at its optimum level ($V_b$=0), it is not practical due to the large value of parasitic capacitance of the photodiode and its effect on the high frequency operation of the oscillator. To alleviate this problem, in another embodiment, the light to frequency converter 10 includes a current controlled oscillator 12A as shown in FIG. 11. The current controlled oscillator 12A of FIG. 11 is similar to that shown in FIG. 2 with the following exceptions. Current controlled oscillator 12A includes a buffered current controlled oscillator. The buffered current controlled oscillator 12A includes a current buffer 162 coupled between the at least one photodiode and a summing junction for isolating the control current $I_D$. The consequence of this buffering is that an AC ground reference (VBIAS) must be moved positive or the oscillator has to be run from split power to keep the buffer circuit from saturating.

The buffered current controlled oscillator 12A of FIG. 11 further includes one-shot 26 responsive to a trigger input for providing a one-shot clock output. Non-overlapping clock generator 28, responsive to the one-shot clock output 46, provides a first non-overlapping clock output 50 and a second non-overlapping clock output 52. Switched capacitor resistor configuration 30 includes the switching capacitor (CQ) 34, having a first input coupled to the first non-overlapping clock output 50, a second input coupled to the second non-overlapping clock output 52, a voltage reference input coupled to the oscillator reference voltage (VREF) 100, and a voltage bias ground reference (VBIAS) at 164. The switched capacitor resistor configuration 30 is responsive to the first, second, and voltage reference inputs and the voltage bias ground reference for providing the feedback current operating at a frequency of operation ($F_O$) at input 58 of integrator 22. The frequency of operation ($F_O$) is a function of the control current, the oscillator reference voltage (VREF), and a capacitance of the switching capacitor (CQ).

Furthermore, in the embodiment of FIG. 11, the integrator 22 includes an op-amp 54 having the control and feedback currents coupled to an inverting input 58 of the op-amp and the voltage bias ground reference 164 coupled to a non-inverting input 62 of the op-amp. The integrator 22 integrates a sum of the control current $I_D$ and the feedback current $I_R$ to provide an output voltage ($V_{X3}$) at 60. Comparator 24 is responsive to the reference voltage VREF coupled to the inverting input 64 and the integrator output 60 coupled to the non-inverting input 66 for providing a pulse signal output at 68 having a frequency of oscillation representative of the intensity of incident light. The pulse signal output at 68 is further coupled to the trigger input 44 of the one-shot 26.

Figure 12:
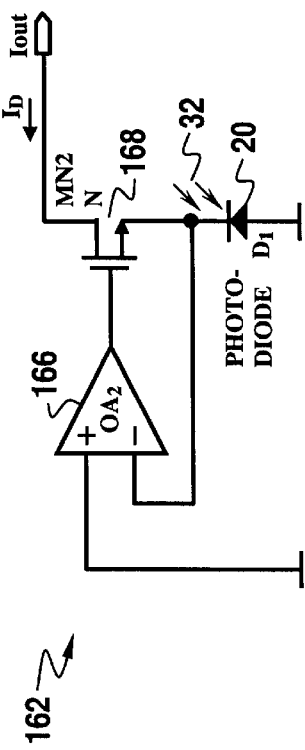
FIG. 12 is an electrical schematic diagram of a photodiode with current buffer of FIG. 11, according to another embodiment of the present disclosure.

FIG. 12 illustrates an electrical schematic diagram of the photodiode 20 with the current buffer 162 of FIG. 11 for isolating the photodiode, according to one embodiment of the present disclosure. In this embodiment, current buffer 162 includes op-amp (OA2) 166 and switch (MN2) 168 coupled to photodiode 20, as shown in FIG. 12.

Figure 13:
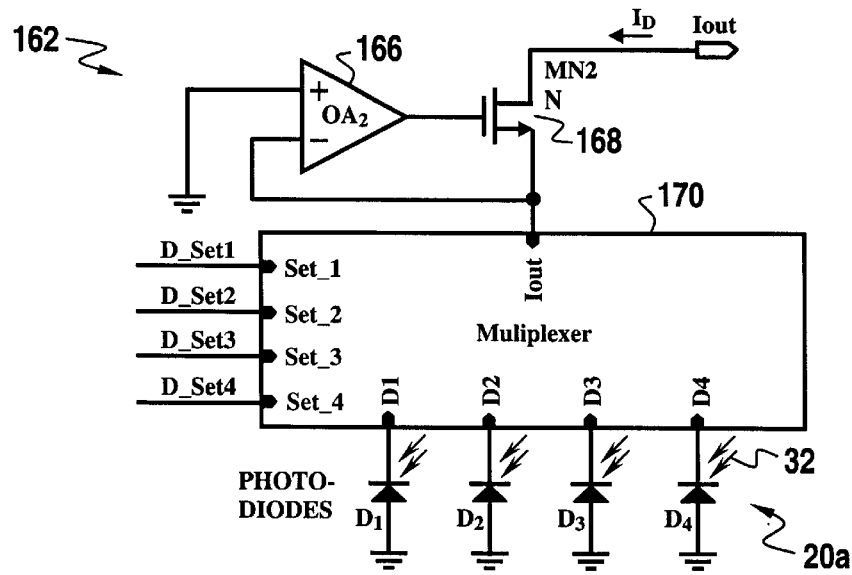
FIG. 13 is an electrical block diagram of a plurality of photodiodes with current buffer of FIG. 11, according to another embodiment of the present disclosure.
Figure 14:
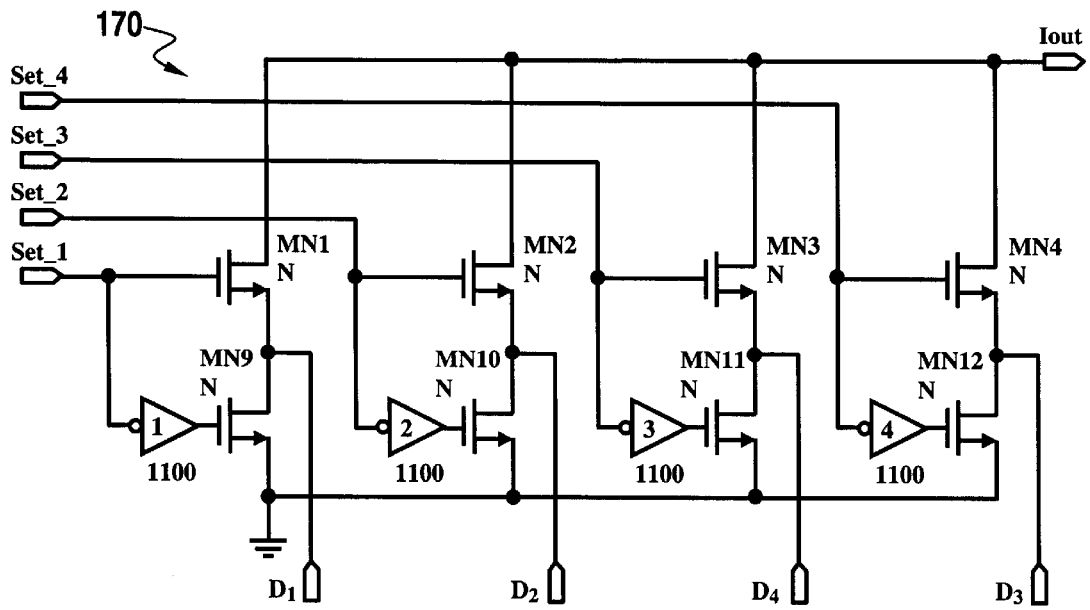
FIG. 14 is an electrical schematic diagram of the diode multiplexer of FIG. 13, according to another embodiment of the present disclosure.

FIG. 13 illustrates an electrical block diagram of a plurality of photodiodes with current buffer 162 of FIG. 11, according to another embodiment of the present disclosure. The at least one photodiode 20 includes a plurality of photodiodes 20a coupled to the current buffer via a multiplexer 170. The multiplexer 170 is configured to multiplex a desired one of the plurality of photodiodes 20a to the current buffer 162 under digital control. Accordingly, the multiplexer 170 enables different photodiode currents to be input to the oscillator 12a. That is, the multiplexer switches photodiodes D1–D4 in or out of the circuit under digital control. FIG. 14 is an electrical schematic diagram of the diode multiplexer 170 of FIG. 13.

Figure 15:
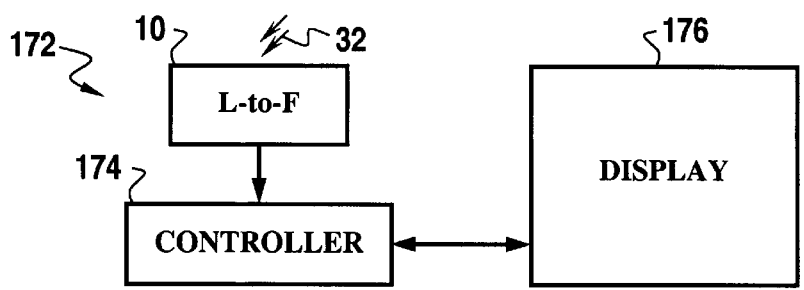
FIG. 15 is a block diagram view of an apparatus including a light-to-frequency converter, according to another embodiment of the present disclosure.

Referring now to FIG. 15, a block diagram view of an apparatus having a light intensity control function according to another embodiment shall be discussed. The apparatus having a light intensity control function is generally indicated by the reference numeral 172. Apparatus 172 includes a monolithic light to frequency converter 10, as shown and described with respect to FIG. 1 and subsequent Figures. The apparatus further includes a controller 174, such as a microprocessor, micro controller, computer, control logic circuitry, or the like for controlling a device parameter of device 176. In one embodiment, the controller 174 is responsive to the output signal of the light-to-frequency converter 10, the output signal having a frequency ($F_O$) proportional to the intensity of the incident light 32, for controlling the device parameter according to the particular requirement of apparatus 172 and/or device 176 application. In another embodiment, controller 174 may include any suitable control device, circuit, or processor for performing a desired functionality, as discussed herein.

For example, controller 174 provides light intensity information on output 178 in response to the output signal of the light to frequency converter 10. Output 178 provides light intensity information according to the requirements of a particular light detector application. In addition, controller 174 may provide suitable control signals on control output 178 to device 176, according to the requirements of the particular light intensity control application.

In one embodiment, controller 174 may also contain circuitry for conditioning the output of the light-to-frequency converter 10 and translating the results of the conditioned output into alternate forms of light intensity information. For example, conditioning may include averaging, or other conditioning suitable for a particular light intensity measurement application.

According to yet another embodiment, controller 174 further performs a translation of the conditioned output that includes, for example, arithmetic processing and use of a table look-up. The translation may be also be accomplished with at least one of hard-wired logic and stored program logic, such as via a microprocessor.

Device 176 may include any device responsive to a light intensity control signal for producing a desired response as a function of the intensity of light. An illustrative device may include a rear view mirror of an automobile, the rear view mirror for being controlled in a desired manner in response to a measure of the intensity of light by the light to frequency converter 10, for example.

Device 176 may also include a display, such as for a laptop computer or other device, for example. Controlling the backlighting of the display screen according to the intensity of incident light on the laptop computer can facilitate improved power management, extending a useful battery life between recharging periods of the same. Other electronic devices, such as hand held electronic devices, capable of providing backlighting with an artificial illumination, are also contemplated.

In the example of the immediately preceding paragraph, controller 174 may include a means for controlling a display parameter in response to the measure of light intensity of the incident light. The display parameter may include any parameter to be controlled in response to the measure of light intensity of the incident light. The display parameter may include, for example, a backlight control parameter of the display device. The backlight control parameter may include a first level for the intensity of incident light and a second level for the intensity of incident light. The first and second levels can correspond, for example, to providing backlighting and providing no backlighting, respectively. The first and second levels may also include additional levels of light intensities, with corresponding control actions.

Although only a few exemplary embodiments of this invention have been described in detail above, those skilled in the art will readily appreciate that many modifications are possible in the exemplary embodiments without materially departing from the novel teachings and advantages of this invention. For example, the functionality of the various embodiments as discussed herein can be provided on a single monolithic integrated circuit. Accordingly, all such modifications are intended to be included within the scope of this invention as defined in the following claims. In the claims, means-plus-function clauses are intended to cover the structures described herein as performing the recited function and not only structural equivalents, but also equivalent structures.

What is claimed is:

1. An integrated circuit adapted to output a bandgap reference voltage with temperature coefficient compensation (VBG_TC), comprising:

a first circuit responsive to a bandgap reference voltage (VBG) for generating a temperature stable reference current;

a second circuit for applying the temperature stable reference current through a current mirror to a current summing junction;

a third circuit for summing the temperature stable reference current against a current proportional to absolute temperature (IPTAT); and a fourth circuit for converting the summed current into the bandgap reference voltage with temperature coefficient compensation (VBG_TC).

2. The integrated circuit of claim 1, wherein said fourth circuit includes an op-amp having a non-inverting input, an inverting input, and an output, the bandgap reference voltage (VBG) being coupled to the op-amp non-inverting input, the summing junction being coupled to the op-amp inverting input, wherein the circuit further includes a feedback resistor (RTC) coupled between the op-amp inverting input and the op-amp output.

3. The integrated circuit of claim 1, further comprising:

a generator for providing the current proportional to absolute temperature (IPTAT).

4. The integrated circuit of claim 3, wherein said generator for providing the current proportional to absolute temperature (IPTAT) includes a circuit for deriving the current proportional to absolute temperature from matched emitter currents flowing in first and second transistors and described by the expression $$IPTAT = A1*(kT/q)*\ln(A2/A3)*(1/R1),$$

where A1 is a current mirror gain provided by first and second output MOS devices, k is Boltzman's constant, T is absolute temperature, q is electronic charge, A2 is the emitter area of the first transistor, A3 is the emitter area of the second transistor, and R1 is a resistance coupled to the emitter of the first transistor.

5. The integrated circuit of claim 3, further wherein the value of the current proportional to absolute temperature (IPTAT) is set to match a reference current defined by the bandgap reference voltage divided by a reference resistance (VBG/RREF) at a temperature equal to 27 degrees Celsius such that the bandgap reference voltage with temperature coefficient compensation (VBG_TC) equals the bandgap reference voltage (VBG) at that temperature.

6. The integrated circuit of claim 3, still further wherein controlling the temperature coefficient includes selecting a value for RTC to allow for operation at optimum temperature coefficient (TC) levels in the infrared spectrum without placing additional constraints on a remainder of the integrated circuit.

7. The integrated circuit of claim 3, wherein said generator for providing the current proportional to absolute temperature (IPTAT) includes a circuit for equalizing emitter currents of a first and a second transistor, the circuit further having means for trimming out error to achieve a desired frequency tolerance.

8. The integrated circuit of claim 7, further wherein the error includes an offset error, and wherein the means for trimming out error includes at least a single transistor digital to analog converter (DAC) configured to alter the effective emitter area of the transistors for nulling the offset error.

9. The integrated circuit of claim 8, wherein the DAC includes at least two inputs and an output, the DAC responsive to the at least two inputs for providing a variable impedance from the output to ground as a function of the at least two inputs which will vary the current flowing in the first and second transistors.

10. The integrated circuit of claim 1, further comprising:
a bandgap reference voltage generator for generating the bandgap reference voltage (VBG), wherein said bandgap voltage generator includes a circuit having an op-amp for equalizing emitter currents of a first transistor and a second transistor, the circuit further having means for trimming out error to achieve a desired frequency tolerance.

11. The integrated circuit of claim 10, wherein the error includes an offset error, and wherein the means for trimming out error includes a transistor digital to analog converter (DAC) configured to alter an effective emitter area of the first transistor for nulling the offset error.

12. The integrated circuit of claim 11, wherein the DAC includes at least two inputs and an output, the DAC responsive to the at least two inputs for providing a variable impedance from the output to ground as a function of the at least two inputs which will vary current flowing in the first and second bandgap transistors, which, in turn, will vary the bandgap reference voltage.

13. A method for generating a bandgap reference voltage with temperature coefficient compensation (VBG_TC) comprising:
generating a temperature stable reference current in response to a bandgap reference voltage (VBG);
applying the temperature stable reference current through a current mirror to a current summing junction;
summing the temperature stable reference current against a current proportional to absolute temperature (IPTAT); and
converting the summed current into the bandgap reference voltage with temperature coefficient compensation (VBG_TC).

14. The method of claim 13, wherein converting the summed current into the bandgap reference voltage with temperature coefficient compensation (VBG_TC) includes providing an op-amp having a non-inverting input, an inverting input, and an output, coupling the bandgap reference voltage (VBG) to the op-amp non-inverting input, coupling the summing junction to the op-amp inverting input, further including providing a feedback resistor (RTC) coupled between the op-amp inverting input and the op-amp output.

15. The method of claim 13, wherein generating the bandgap reference voltage with temperature coefficient compensation (VBG_TC) further includes generating the current proportional to absolute temperature (IPTAT).

16. The method of claim 15, wherein generating the current proportional to absolute temperature (IPTAT) includes deriving the current proportional to absolute temperature from matched emitter currents flowing in first and second transistors and described by the expression $$IPTAT = A1*(kT/q)*\ln(A2/A3)*(1/R1),$$

where A1 is a current mirror gain provided by first and second output MOS devices, k is Boltzman's constant, T is absolute temperature, q is electronic charge, A2 is the emitter area of the first transistor, A3 is emitter area of the second transistor, and R1 is a resistance coupled to the emitter of the first transistor.

17. The method of claim 15, further wherein the value of the current proportional to absolute temperature (IPTAT) is set to match a reference current defined by the bandgap reference voltage divided by a reference resistance (VBG/RREF) at a temperature equal to 27 degrees Celsius such that the bandgap reference voltage with temperature coefficient compensation (VBG_TC) equals the bandgap reference voltage (VBG) at that temperature.

18. The method of claim 15, still further wherein controlling the temperature coefficient includes selecting a value for RTC to allow for operation at optimum temperature coefficient (TC) levels in the infrared spectrum.

19. The method of claim 13, further comprising:
generating a bandgap reference voltage by equalizing emitter currents of a first transistor and a second transistor; and
trimming out error to achieve a desired frequency tolerance.

20. The method of claim 19, wherein the error includes an offset error, and wherein trimming out error includes altering an effective emitter area of the first transistor to null the offset error.

21. The method of claim 20, wherein altering the effective emitter area of the first transistor includes providing a variable impedance to ground which will vary current flowing in the first and second bandgap transistors, which, in turn, will vary the bandgap reference voltage.

22. A method for generating a bandgap reference voltage with temperature coefficient compensation (VBG_TC) comprising:
generating a bandgap reference voltage by equalizing emitter currents of a first transistor and a second transistor and trimming out error to achieve a desired frequency tolerance;

generating a temperature stable reference current in response to the bandgap reference voltage (VBG);

applying the temperature stable reference current through a current mirror to a current summing junction;

summing the temperature stable reference current against a current proportional to absolute temperature (IPTAT); and converting the summed current into the bandgap reference voltage with temperature coefficient compensation (VBG$_{13}$ TC), wherein converting the summed current into the bandgap reference voltage with temperature coefficient compensation (VBG_TC) includes providing an op-amp having a non-inverting input, an inverting input, and an output, coupling the bandgap reference voltage (VBG) to the op-amp non-inverting input, coupling the summing junction to the op-amp inverting input, further including providing a feedback resistor (RTC) coupled between the op-amp inverting input and the op-amp output.

23. The method of claim 22, wherein the error includes an offset error, and wherein trimming out error includes altering an effective emitter area of the first transistor to null the offset error, further wherein altering the effective emitter area of the first transistor includes providing a variable impedance to ground which will vary current flowing in the first and second bandgap transistors, which, in turn, will vary the bandgap reference voltage, and wherein generating the bandgap reference voltage with temperature coefficient compensation (VBG_TC) further includes generating the current proportional to absolute temperature (IPTAT), wherein generating the current proportional to absolute temperature (IPTAT) includes deriving the current proportional to absolute temperature from matched emitter currents flowing in first and second transistors and described by the expression $$IPTAT = A1*(kT/q)*\ln(A2/A3)*(1/R1),$$

where A1 is a current mirror gain provided by first and second output MOS devices, k is Boltzman's constant, T is absolute temperature, q is electronic charge, A2 is the emitter area of the first transistor, A3 is emitter area of the second transistor, and R1 is a resistance coupled to the emitter of the first transistor.

* * * * *